(12) United States Patent
Hayashi et al.

(10) Patent No.: US 8,665,608 B2
(45) Date of Patent: Mar. 4, 2014

(54) CIRCUIT BOARD PACKAGING STRUCTURE

(75) Inventors: Yoshito Hayashi, Atsugi (JP); Masakatsu Tanji, Oi (JP)

(73) Assignee: Hitachi, Ltd., Tokyo (JP)

( * ) Notice: Subject to any disclaimer, the term of this patent is extended or adjusted under 35 U.S.C. 154(b) by 339 days.

(21) Appl. No.: 13/071,305

(22) Filed: Mar. 24, 2011

(65) Prior Publication Data

US 2011/0292620 A1 Dec. 1, 2011

(30) Foreign Application Priority Data

May 26, 2010 (JP) .................................. 2010-120124

(51) Int. Cl.
*H05K 7/14* (2006.01)
*H05K 7/18* (2006.01)

(52) U.S. Cl.
USPC ........................... 361/801; 361/825; 361/728

(58) Field of Classification Search
USPC ......... 361/815, 755, 801–803, 807, 809, 810, 361/728–730, 825, 826
See application file for complete search history.

(56) References Cited

U.S. PATENT DOCUMENTS

| | | | | |
|---|---|---|---|---|
| 6,111,517 A | * | 8/2000 | Atick et al. | 340/5.83 |
| 6,618,270 B2 | * | 9/2003 | Babin et al. | 361/818 |
| 7,663,889 B2 | * | 2/2010 | Lajara et al. | 361/759 |
| 7,684,210 B2 | * | 3/2010 | Kosugi et al. | 361/801 |
| 8,009,440 B2 | * | 8/2011 | Desrosiers et al. | 361/802 |

FOREIGN PATENT DOCUMENTS

| | | |
|---|---|---|
| JP | 2002-512454 | 4/2002 |
| JP | 2003-522422 | 7/2003 |
| JP | 2005-122630 | 5/2005 |
| JP | 2006-054342 A | 2/2006 |
| WO | WO 99/55127 | 10/1999 |
| WO | WO 02/21888 A1 | 3/2002 |

* cited by examiner

*Primary Examiner* — Hung S Bui
(74) *Attorney, Agent, or Firm* — Foley & Lardner LLP

(57) ABSTRACT

The circuit board packaging structure capable of inserting and extracting an interface part of a circuit board into and from a connector part of the processing equipment in a direction different from a direction of attaching and detaching the circuit board to and from the processing equipment includes: an operating part which turns on receiving force; a plate part which is fixed to the circuit board to be rotatable in a direction reverse to a turning direction of the operating part, and converts the force received by the operating part to force in a direction different from the attaching and detaching direction to move the circuit board in that direction; a link part which connects the operating part with the plate part to transmit the force received by the operating part to the plate part; and a fastener which fastens the circuit board and the operating part with play.

6 Claims, 4 Drawing Sheets

CIRCUIT BOARD PACKAGING STRUCTURE

CLAIM OF PRIORITY

The present application claims priority from Japanese application serial no. JP2010-120124, filed on May 26, 2010, the content of which is hereby incorporated by reference into this application.

TECHNICAL FIELD

This invention relates to a packaging structure of an information processing equipment carrying a circuit board card such as a Peripheral Component Interconnect (PCI) card.

BACKGROUND ART

A circuit board card containing a relay connector and a circuit for connecting the information processing equipment and other devices to each other for communication therebetween has been frequently used heretofore. As this type of circuit board card, a PCI card is cited, for instance, whose dimensions and packaging system have been often standardized to be on the market. The PCI card has a structure in which one of four sides is provided with a connector tangential part for an internal interface to be connected to the interior of the information processing equipment body, and one side adjacent to the side provided with the connector tangential part includes a connector for an external interface.

Generally the information processing equipment is mounted to a server rack, and the external interface connector of the PCI card is laid out to project to the front or the back of the information processing equipment for connecting a cable thereto. In this case, in the above PCI card structure, the insert/extract direction of the internal interface connector is vertical to the front or the back of the information processing equipment. Therefore, in order to attach and detach the PCI card to and from the information processing equipment, it is necessary to once draw out the information processing equipment from the server rack, remove a top plate, and then attach and detach the same from the top face of the processing equipment. Alternatively it is necessary to provide an extension board for inserting and extracting the PCI card into and from the front or the back of the information processing equipment.

In recent years, in order to address the problem, there is proposed a carrier mounting system including a mechanism structure for inserting the PCI card from the front or the back of the information processing equipment, and turning and sliding the PCI card inserted at a predetermined position to insert and extract the connector of the internal interface (e.g. Japanese Unexamined Patent Application Publication No. 2005-122630 and Japanese Unexamined Patent Application Publication (Translation of PCT Application) No. 2003-522422).

SUMMARY OF INVENTION

In the carrier mounting system disclosed in the above Japanese Unexamined Patent Application Publication No. 2005-122630 and Japanese Unexamined Patent Application Publication (Translation of PCT Application) No. 2003-522422), it is the most important and difficult to achieve how to transmit the force for moving the PCI card parallel to be inserted into and extracted from the outer surface of the carrier. That is, it is ideal that in order to insert and extract the PCI card into and from the internal interface connector, the PCI card is moved parallel to the direction of inserting and extracting the connector, and further the inserting and extracting force is applied onto the central axis of the connector.

In order to reduce the size of the information processing equipment, however, space for pressing the upside of the PCI card by hand cannot be provided, so that a lever should be disposed on the external interface side surface where the carrier is projected over the information processing equipment. In this case, since the operating point of the lever is outside the carrier, a slide guide is provided to forcibly move the PCI card parallel in the interior of the carrier. As described above, however, the position of the slide guide is separated from the position of the lever, resulting in the problem that the lever is caught in the middle of sliding or the slide is scraped off by friction.

This invention has been made to address the problem of the above related art and provides a circuit board packaging structure, which may smoothly insert and extract a circuit board card such as a PCI card into and from the front or the back of an information processing equipment.

In order to address the above problem, this invention provides a circuit board packaging structure, in which an interface part of a circuit board can be inserted into and extracted and from a connector part of a device in a direction different from a direction of attaching and detaching the circuit board to and from the device, including: an operating part which turns on receiving force from an operator; a plate part which is fixed to the circuit board to be rotatable in a direction reverse to a turning direction of the operating part, and converts the force received by the operating part to force in a direction different from the attaching and detaching direction to move the circuit board in that direction; a link part which connects the operating part with the plate part to transmit the force received by the operating part to the plate part; and a fastener, which fastens the circuit board and the operating part with play in the circuit board.

According to the invention, it is possible to provide the circuit board packaging structure, which may allow the circuit board card such as a PCI card to be smoothly inserted into and extracted from the front or the back of the information processing equipment.

DETAILED DESCRIPTION OF THE PREFERRED EMBODIMENT

An embodiment of a circuit board packaging structure in accordance with the invention will now be described in detail with reference to the attached drawings. Although the following description deals with the case of applying the circuit board packaging structure to the PCI carrier, this is not particularly restrictive. Although the following description deals with the case in which the PCI carrier is inserted and extracted into and from the information processing equipment such as a server device, the invention may be applied to various electronic apparatuses such as a printer and a compound machine.

Figure 1:
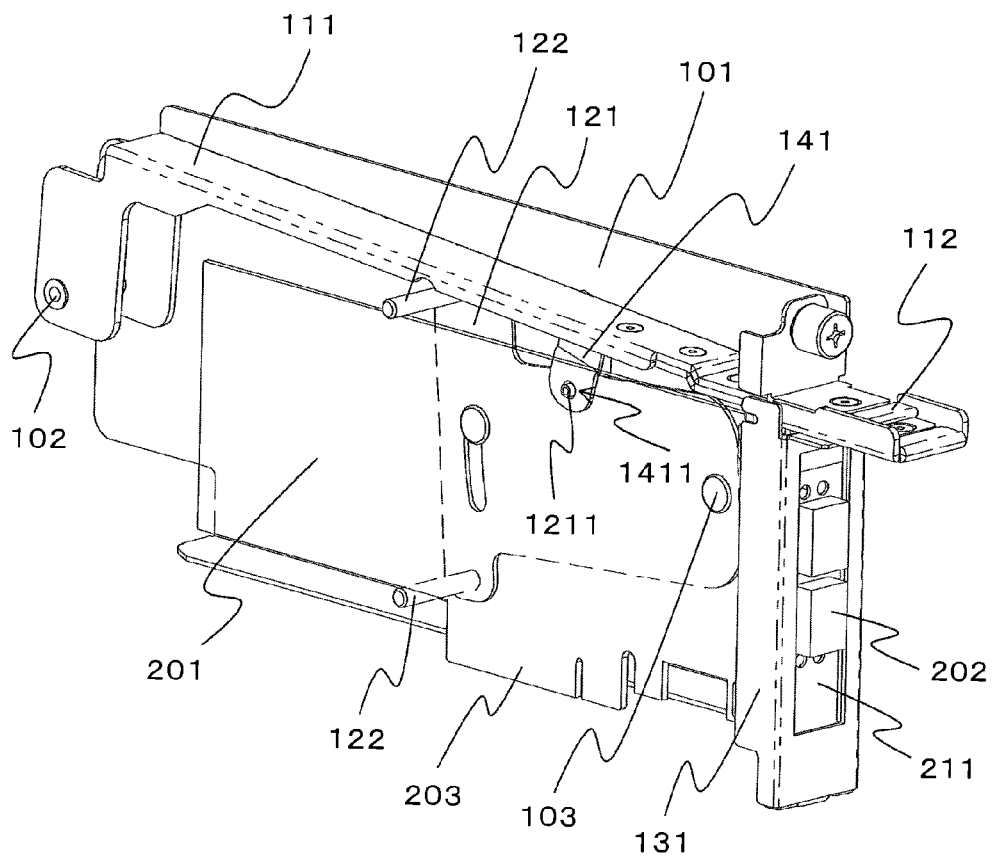
FIG. 1 is a perspective view showing the outline of a packaging structure of a PCI carrier according to an embodiment.

FIG. 1 is a perspective view showing the outline of a PCI carrier packaging structure according to the embodiment. As shown in FIG. 1, the PCI carrier in accordance with the embodiment includes: a base plate 101 serving as a base of a PCI carrier body; a lever 111 for applying the operating force by an operator; a link plate 121 for converting the force applied to the lever 111 to the vertical motion of a PCI card 201; and a front cover 131 abutted to a PCI bracket 211 attached to the PCI card 201 to intercept electromagnetic noise (a radio shield).

The PCI card 201 includes: an external interface 202 for connection to an external device; and an internal interface tangential part 203 for connecting the PCI card 201 to the information processing equipment. As shown in FIG. 1, the external interface 202 and the internal interface tangential part 203 are provided on one side of the PCI card 201 and another side adjacent to the one side, so that the external device and the information processing equipment are connected to each other in a vertical direction.

The description deals with the case in which the internal interface tangential part 203 is provided on one side of the PCI card 201 that is below vertically to the direction of inserting the PCI carrier, and the PCI carrier is pushed downward vertically to the inserting direction from the state of being inserted into the information processing equipment in the present embodiment. However, the invention may be applied to the case in which the internal interface tangential part 203 is provided on one side of the PCI card 201 that is above vertically to the direction of inserting the PI carrier, and the PCI carrier is pulled upward vertically to the inserting direction from the state of being inserted into the information processing equipment, thereby mounting the PCI card 201 to the information processing equipment.

The lever 111 can be pivoted on a lever rotation axis 102 provided on the base plate 101 when a handle part 112 provided at one end of the lever 111 on the opposite side to the lever rotation axis 102 is operated from the outside by the operator's fingers or the like. To be concrete, when the operator pushes down the handle part 112 vertically to the axial direction of the lever rotation axis 102 by his fingers or the like, the lever 111 rotates from the position in the state where the PCI carrier is inserted into the information processing equipment (the position before the PCI card 201 is pushed down) up to the position where the internal interface tangential part 203 is mounted to the information processing equipment (the position after the PCI card 201 is pushed down) in the state where the PCI carrier is inserted into the information processing equipment to draw a circular arc around the lever rotation axis 102.

On the other hand, in the case where the operator extracts the PCI carrier from the information processing equipment, contrary to the case of inserting the PCI carrier into the information processing equipment, when the operator pulls up the handle part 112 vertically to the axial direction of the lever rotation axis 102, the lever is rotated from the position where the PCI card 201 is pushed down to the initial position (the position when the PCI carrier is inserted into the information processing equipment).

The link plate 121 is fixed to turn on a pivot pin 103 provided on the base plate 101. The link plate 121 is fixed to the PCI card 201 to rotate in the direction opposite to the rotating direction of the lever 111, thereby converting the force received by the lever 111 to the force in the direction different from the attaching and detaching direction to move the PCI card 201 in the direction different from the attaching and detaching direction.

A part of the upper edge of the link plate 121 is provided with a hold pin 122 for transmitting the force from the pushed-down lever 111 to the PCI card 201. The hold pin 122 plays a function of pushing the PCI card 201 downward when the hold pin 122 abuts on the upper edge of the PCI card 201 and the whole link plate 121 turns on the pivot pin 103.

Further, a part of the lower edge of the link plate 121 is provided with a hold pin 122 for transmitting the force from the pulled-up lever 111 to the PCI card 201, contrary to the hold pin 122 provided on the part of the upper edge. The hold pin 122 plays a function of pushing the PCI card 201 upward when the hold pin abuts on the lower edge of the PCI card 201 and the whole link plate 121 turns on the pivot pin 103. Further, the link plate 121 is connected to the lever 111 as well by a joint plate 141.

Figure 2:
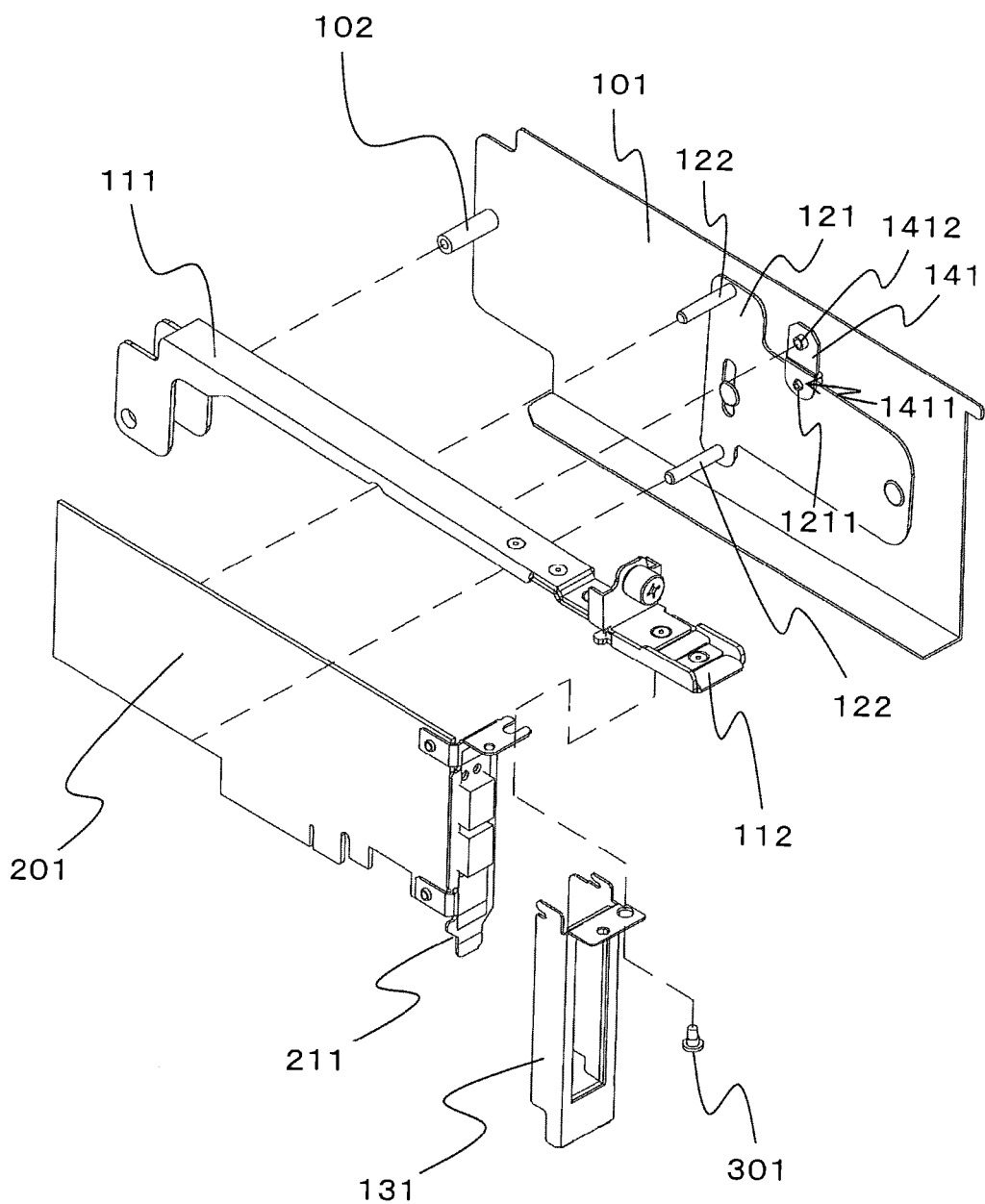
FIG. 2 is an exploded perspective view of the PCI carrier shown in FIG. 1.

FIG. 2 is an exploded perspective view of the PCI carrier shown in FIG. 1. As shown in FIG. 2, the joint plate 141 includes an opening 1411 provided at the lower part thereof for connection to the link plate 121. The upside of the link plate 121 is provided with a link plate pivot 1211 mounted vertically to the plane of the link plate 121. The link plate pivot 1211 of the link plate 121 engages with the opening 1411 of the joint plate 141, whereby the joint plate 141 is rotatably connected to the link plate 121 (alternatively, the link plate 121 is rotatably connected to the joint plate 141).

Further, the joint plate 141 includes a joint plate pivot 1412 provided at the upper part for connection to the lever 111. The lever 111 is provided with an opening 1111 (See FIG. 3, FIG. 4) for connection to the joint plate 141. The joint plate pivot 1412 of the joint plate 141 engages with the opening 1111 of the lever 111, whereby the lever 111 is rotatably connected to the joint plate 141 (alternatively, the joint plate 141 is rotatably connected to the lever 111).

Figure 3:
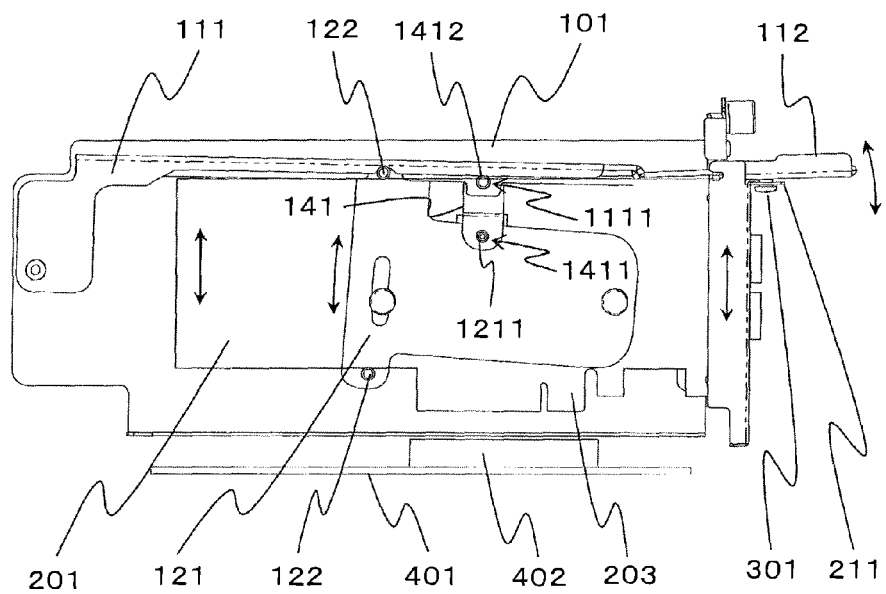
FIG. 3 is a side view showing the condition where a PCI card is extracted from an information processing equipment.
Figure 4:
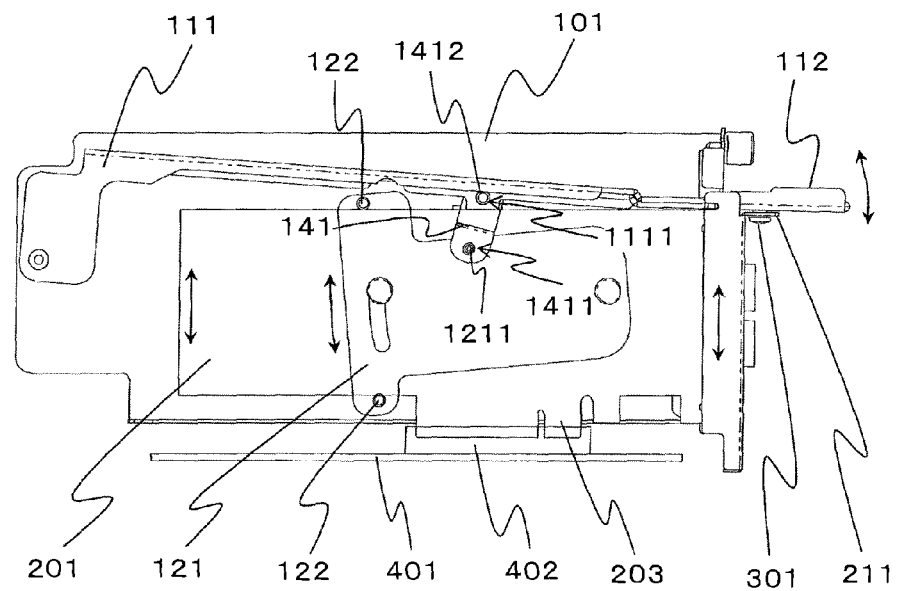
FIG. 4 is a side view showing the condition where the PCI card is inserted in the information processing equipment.

FIG. 3 is a side view showing the condition where the PCI card is extracted from the information processing equipment. FIG. 4 is a side view showing the condition where the PCI card is inserted into the information processing equipment.

As shown in FIG. 3, when the lever 111 is pulled upward around the lever axis 102 by the operator's fingers or the like, the joint plate 141 connected to the lever 111 pulls upward the link plate 121 on receiving the above force. At this time, the link plate 121 is turned on the pivot pin 103 by the pull-up force, and according to the turning, the hold pins 122 provided at the upper and lower parts of the link plate 121 are also turned on the pivot pin 103.

At this time, the hold pin 122 provided at the lower part of the link plate 121 abuts on the lower edge of the PCI card 201 to thereby push upward the PCI card 201 while sliding along the lower edge, and the hold pin 122 provided at the upper part of the link plate 121 presses and holds the pushed up PCI card 201 not to be oblique to the pull-up direction while sliding along the upper edge of the PCI card 201 pushed upward.

To be concrete, when the lever 111 is pulled upward, the force from the link plate 121 pulled upward by the lever 111 through the joint plate 141, the force of the hold pin 122 provided at the lower part of the link plate 121, which pushes up the PCI card 201, and the force of the hold pin 122 provided at the upper part of the link plate 121, which holds the PCI card 201 while pressing, are balanced. Therefore, the PCI card 201 can be pulled vertically upward (parallel to the contact surface between the internal interface tangential part 203 and an insertion opening (a connector) of the information processing equipment, so that the internal interface tangential part 203 will not be damaged due to inclination of the PCI card 201. Further, it is not necessary to provide a guide for pulling the PCI card 201 vertically upward.

As shown in FIG. 4, when the lever 111 pushed down by the operator's fingers or the like pushes the joint plate 141 downward, the joint plate 141 pushes down the link plate 121 while turning on the joint plate pivot 1412 on receiving the force. The link plate 121 turns on the pivot pin 103 downward on receiving the force from the joint plate 141 by the link plate pivot 1211.

At this time, the hold pin 122 provided at the upper part of the link plate 121 abuts on the upper edge of the PCI card 201 to thereby push the PCI card 201 downward while sliding along the upper edge, and the hold pin 122 provided at the lower part of the link plate 121 lifts and holds the pushed down PCI card 201 not to be oblique to the push-down direction while sliding along the lower edge of the pushed down PCI card 201.

To be concrete, when the lever 111 is pushed downward, the force from the link plate 121 pushed downward by the lever 111 through the joint plate 141, the force of the hold pin 122 provided at the upper part of the link plate 121, which pushes down the PCI card 201, and the force of the hold pin 122 provided at the lower part of the link plate 121, which holds the PCI card 201 while lifting, are balanced. Therefore, the PCI card 201 can be pulled vertically downward (parallel to the contact surface between the internal interface tangential part 203 and the insertion opening of the information processing equipment); so that the internal interface tangential part 203 will not be damaged due to inclination of the PCI card 201. Further, it is not necessary to provide a guide for pushing the PCI card 201 vertically downward.

Thus, when the PCI card 201 is pulled up or pushed down vertically, the lever 111 turns while drawing an arc around the lever rotation axis 102. Consequently, the force exerted in the direction in which the internal interface tangential part 203 of the PCI card 201 is parallel to the contact surface between the internal interface tangential part 203, and the insertion opening of the information processing equipment is sometimes applied to cause the internal interface tangential part 203 to shift from the insertion opening of the information processing equipment. Then, the lever 111 and the PCI card 201 are fixed to each other so that the force exerted on the lever 111 is prevented from acting directly on the PCI card 201.

Figure 5:
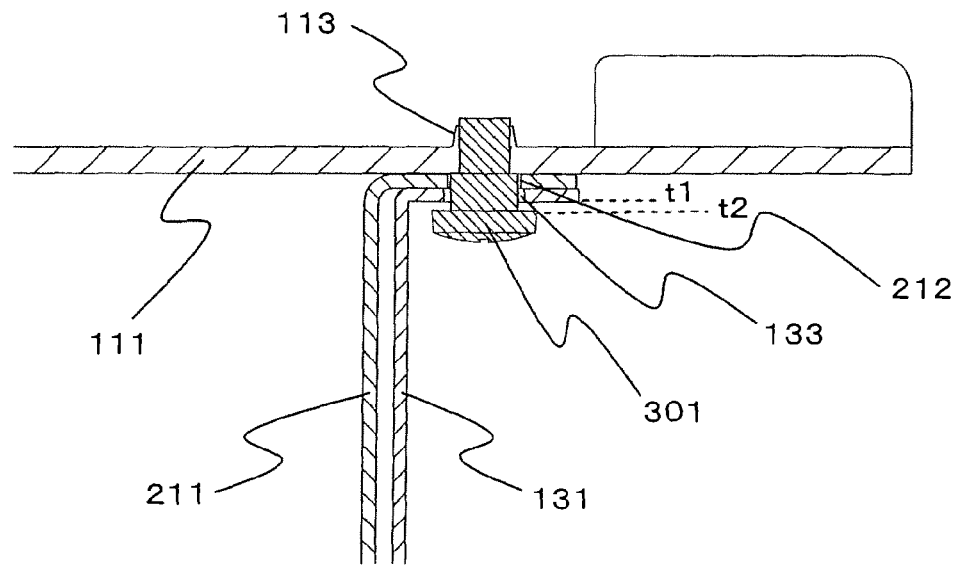
FIG. 5 is a diagram showing the condition where a lever, a PCI bracket and a front cover are fixed.

FIG. 5 is a diagram showing the condition where the lever 111, a PCI bracket 211 and a front cover 131 are fixed to each other. As shown in FIG. 5, the lever 111, the PCI bracket 211 and the front cover 131 are fixed to each other by a shoulder screw 301.

The lever 111 is provided with a tapped hole 113 for inserting the shoulder screw 301. In the PCI bracket 211 attached to the external interface 202 side of the PCI card 201, an insertion tongue part of the PCI bracket 211 is provided with a fixing cutout 212 (an opening) to fix the lever 111 and the PCI bracket 211 to each other. Further, the front cover 131 is provided with a circular hole 133 for fixing to the PCI bracket 211.

As shown in FIG. 5, the shoulder screw 301 is inserted into the tapped hole 113, the fixing cutout 212 and the circular hole 133, whereby the lever 111, the PCI bracket 211 and the front cover 131 are screwed to each other.

The PCI card 201 is inserted into the connector part of the information processing equipment while being mounted to the information processing equipment by the hold pins 122 provided at the upper and lower parts of the link plate 121 and the shoulder screw 301, or extracted from the connector part.

To be more concrete, the shoulder screw 301 is passed from the circular hole 133 provided in the front cover 131 through the fixing cutout 212 provided in the PCI bracket 211, and inserted into the tapped hole 113 provided in the handle part 112 of the lever 111, thereby fixing these members to each other. At this time, a step of the shoulder screw 301 is set larger than the sum of the board thickness of the front cover 131 and the board thickness of the PCI bracket 211, so that although the front cover and the PCI bracket are held by the shoulder screw 301, they are put in the state of being not completely fixed.

That is, the thickness t1 of the upper step part of the shoulder screw 301 is set larger than the sum t2 of the board thickness of the front cover 131 and the board thickness of the PCI bracket 211, thereby forming a gap (play) s. The gap s is thus formed, whereby even when the PCI card 201, as shown in FIG. 3 and FIG. 4, turns so that the lever 111 draws an arc around the lever rotation axis 102, the force from the lever 111 in the direction of the lever rotation axis 102 is absorbed by the gap s to enable the PCI card 201 to move only up and down vertically (without following the turning of the lever 111).

As described above, in the circuit board packaging structure, in which the interface part of the PCI card 201 is inserted into and extracted and from the connector part of the information processing equipment in the direction different from the direction of attaching and detaching the PCI card 201 to and from the information processing equipment, the lever 111 turns on receiving the force from an operator, the link plate 121 is fixed to the PCI card 201 to be rotatable in the direction reverse to the turning direction of the lever 111 to convert the force received by the lever 111 to the force in the direction different from the attaching and detaching direction and move the PCI card 201 in that direction, the joint plate 141 connects the lever 111 with the link plate 121 to transmit the force received by the lever 111 to the link plate 121, the shoulder screw 301 fastens the PCI card 201 and the lever 111 with play in the PCI card 201, so that the circuit board card such as the PCI card can be smoothly inserted into and extracted from the front and the back of the information processing equipment.

As shown in FIG. 3 and FIG. 4, for example, when the operator operates the handle part 112 of the lever 111 up and down by his fingers or the like, the PCI card 201 moves up and down by the shoulder screw 301 holding the PCI bracket 211 and the hold pins 122 provided on the link plate 121, and its traffic line may achieve linear movement with respect to an internal interface connector 402 placed on a mother board 401 shown in FIG. 3 and FIG. 4. The mechanism thereof is the link mechanism in which the turning is basic using the hole and the pin, so it is possible to achieve a structure that may not cause frictional resistance and being caught due to sliding.

Figure 6:
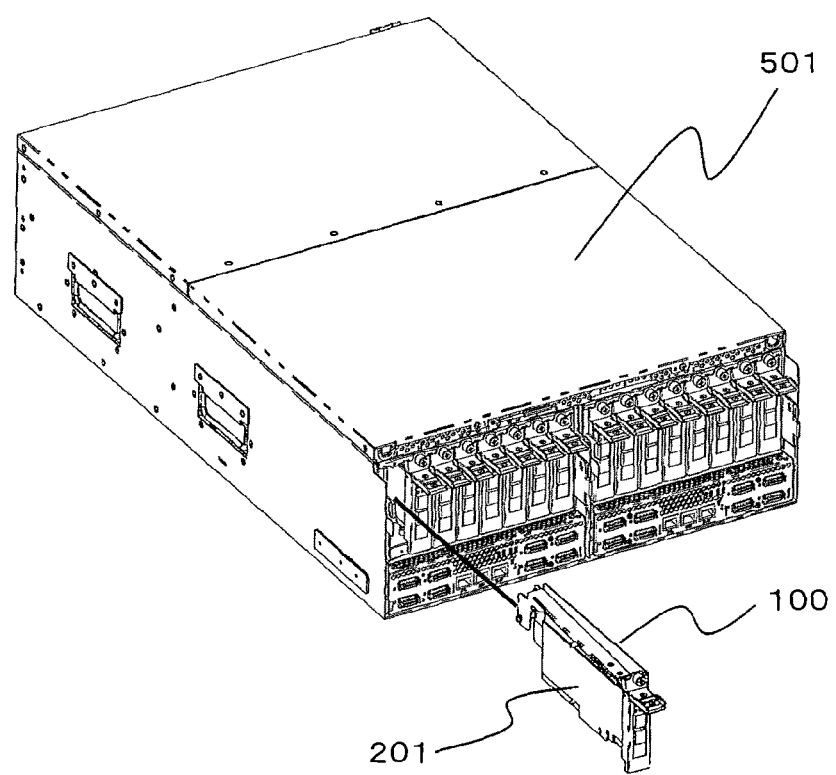
FIG. 6 is a perspective view showing the outline of a packaging structure, in which a PCI carrier in the present embodiment is fitted to the information processing equipment.

FIG. 6 is a perspective view showing the outline of a packaging structure in which a PCI carrier 100 in this embodiment is fitted to an information processing equipment 501. As shown in FIG. 6, in mounting or extracting the PCI carrier 100, the PCI carrier can be easily mounted and extracted even in the case where the information processing equipment is active, without troublesome work such as removal of a top plate in the information processing equipment 501.

Since the power of the lever 111 is thus converted to the insertion and extract force using the link structure turning on the axis and the guide friction is eliminated, the PCI card can be inserted into and extracted from the front or the back of the information processing equipment without moving or stopping the active information processing equipment. Also, being caught due to the slide structure and cutting waste caused by the friction, which are problems of the related art, may be addressed.

The invention is not limited to the embodiment as it is, and the components may be deformed and embodied without departing from the gist in the implementation stage. A plurality of components disclosed in the above embodiment may be suitably combined to form various inventions. For instance, some components may be deleted from the whole components shown in the embodiment. Further, the components for the different embodiments may be suitably combined.

What is claimed is:

1. A circuit board packaging structure, in which an interface part of a circuit board can be inserted into and extracted from a connector part of a device in a direction different from a direction of attaching and detaching the circuit board to and from the device, comprising:
    an operating part which turns on receiving force;
    a plate part which includes a first n abutted on an upper edge of the circuit board and a second pin abutted on a lower edge of the circuit board, is fixed to the circuit board to be rotatable in a direction reverse to a turning direction of the operating part, and is configured to convert the force received by the operating part to provide a force of pushing the circuit board downward or upward;
    a link part which connects the operating part with the plate part to transmit the force received by the operating part to the plate part; and
    a fastener which fastens the circuit board and the operating part with play in the circuit board;
    wherein the operating part is configured such that when the operating part is pushed down, the first pin pushes the circuit board downward while sliding along the upper edge of the circuit board, the second pin lifts and holds the circuit board not to be oblique to a downward direction while sliding along the lower edge of the circuit board.

2. The circuit board packaging structure according to claim 1,
    wherein the operating part is configured to turn on an operation axis vertical and horizontal to the attaching and detaching direction, and
    the plate part is fixed to the circuit board to be turnable on a conversion axis different from the operation axis vertical and horizontal to the attaching and detaching direction.

3. The circuit board packaging structure according to claim 1,
    wherein the link part includes a link pivot part for connection to the operating part and a link opening for penetrating a plate pivot part provided on the plate part through the link part,
    the operating part has an operation opening for penetrating the link pivot part,
    the plate part has the plate pivot part for connection to the link part, and
    the link part connects the operating part with the plate part in a state of being turnable on the link pivot part and the plate pivot.

4. The circuit board packaging structure according to claim 1, wherein the circuit board is configured to be inserted into or extracted from the connector part while being attached to the device by the first pin, the second pin and the fastener.

5. The circuit board packaging structure according to claim 1,
    wherein the fastener includes a shoulder screw,
    the circuit board is fixed to a cover member having a tongue part with an opening,
    the operating part is penetrated through a lower step part of the shoulder screw,
    an opening of the tongue part is penetrated through an upper step part of the shoulder screw, and
    the upper step part of the shoulder screw is formed thicker than the opening of the tongue part.

6. The circuit board packaging structure according claim 1,
    wherein the operating part is configured such that when the operating part is pulled upward, the second pin pushes the circuit board upward while sliding along the lower edge of the circuit board, the first pin presses and holds the circuit board not to be oblique to an upward direction while sliding along the upper edge of the circuit hoard.

* * * * *